US007171742B2

United States Patent
Cromwell et al.

(10) Patent No.: US 7,171,742 B2
(45) Date of Patent: *Feb. 6, 2007

(54) METHOD AND SYSTEM FOR ASSEMBLING A PRINTED CIRCUIT BOARD USING A LAND GRID ARRAY

(75) Inventors: Dan Cromwell, Penryn, CA (US); Rudy Rivera, Aguadilla, PR (US); James Hensley, Rocklin, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 404 days.

This patent is subject to a terminal disclaimer.

(21) Appl. No.: 10/698,780

(22) Filed: Oct. 31, 2003

(65) Prior Publication Data

US 2004/0088853 A1 May 13, 2004

Related U.S. Application Data

(63) Continuation of application No. 10/159,150, filed on May 31, 2002, now Pat. No. 6,660,563.

(51) Int. Cl.
*B23P 19/00* (2006.01)
*H05K 3/30* (2006.01)

(52) U.S. Cl. ............................ 29/740; 29/739; 29/825; 29/832; 438/107; 438/118

(58) Field of Classification Search ................ 29/825, 29/832, 840, 739, 740; 438/107, 121, 118
See application file for complete search history.

(56) References Cited

U.S. PATENT DOCUMENTS

| 5,215,472 | A | * | 6/1993 | DelPrete et al. ............... 439/71 |
| 5,267,867 | A | * | 12/1993 | Agahdel et al. .............. 439/73 |
| 5,883,788 | A | * | 3/1999 | Ondricek et al. ........... 361/768 |
| 6,061,235 | A | * | 5/2000 | Cromwell et al. .......... 361/690 |
| 6,074,219 | A | * | 6/2000 | Tustaniwskyj et al. ....... 439/66 |
| 6,084,178 | A | * | 7/2000 | Cromwell ................. 174/35 R |
| 6,381,844 | B1 | * | 5/2002 | Bollesen .................. 29/890.03 |
| 6,477,058 | B1 | * | 11/2002 | Luebs et al. ................ 361/784 |

* cited by examiner

*Primary Examiner*—Carl J. Arbes

(57) ABSTRACT

A device for assembling circuit boards. The device has an upper surface for receiving a compressing force. The device also has a lower surface for compressing a number of compression devices in a land grid array assembly while allowing access to a number of fasteners associated with the compression devices. The device is able to assist in the formation of an electrical contact between a chip package in the land grid array assembly and a circuit board by the lower surface being pressed against the compression devices to compress the compression devices and then allowing the plurality of fasteners to be tightened.

13 Claims, 7 Drawing Sheets

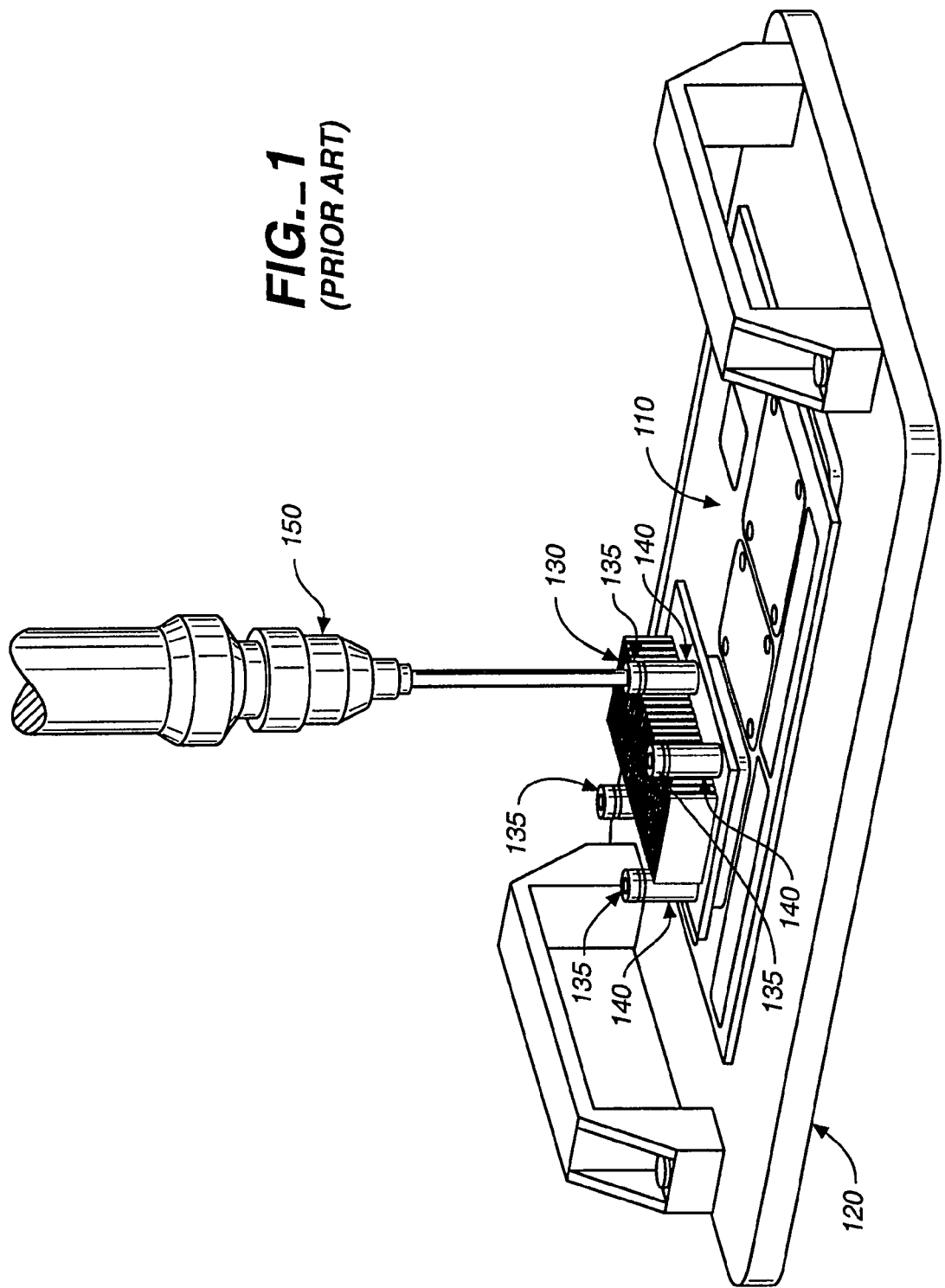
FIG._1
*(PRIOR ART)*

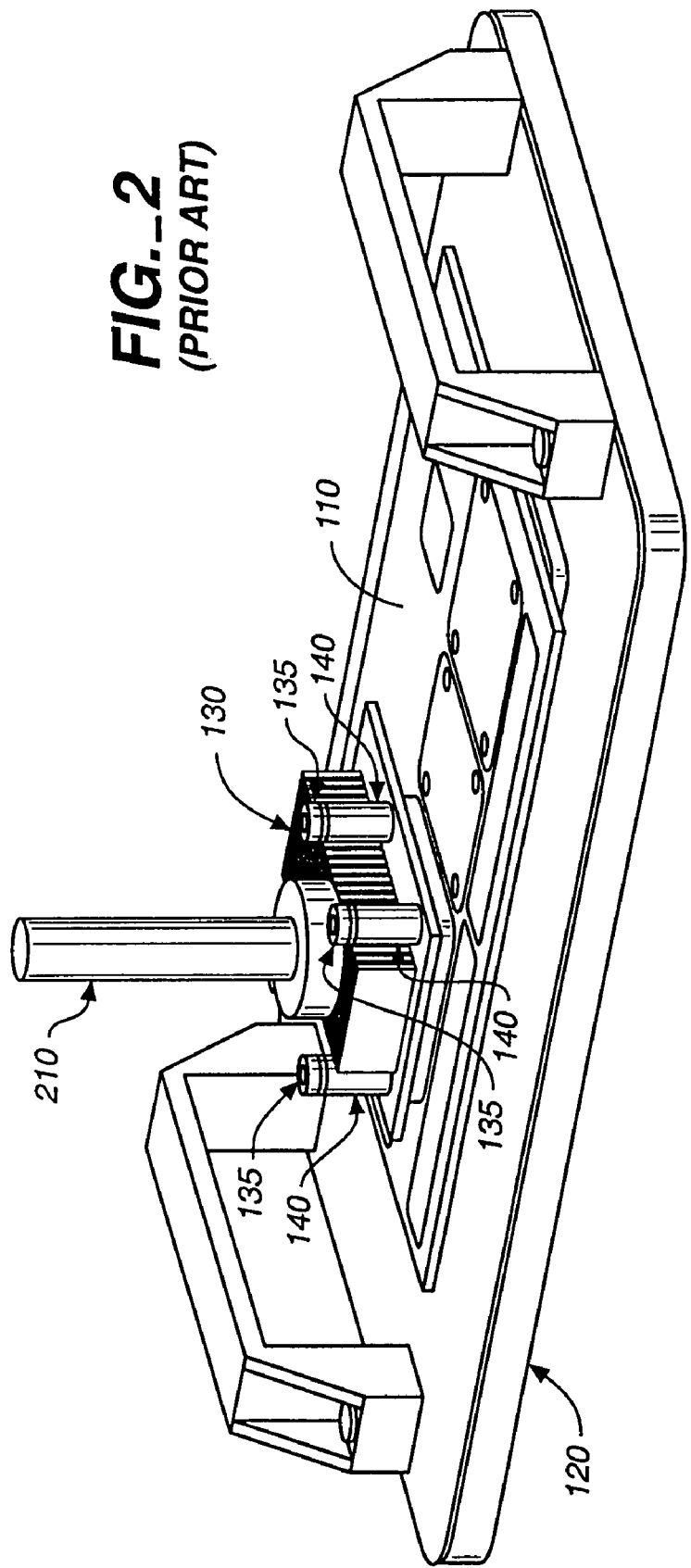
FIG._2 (PRIOR ART)

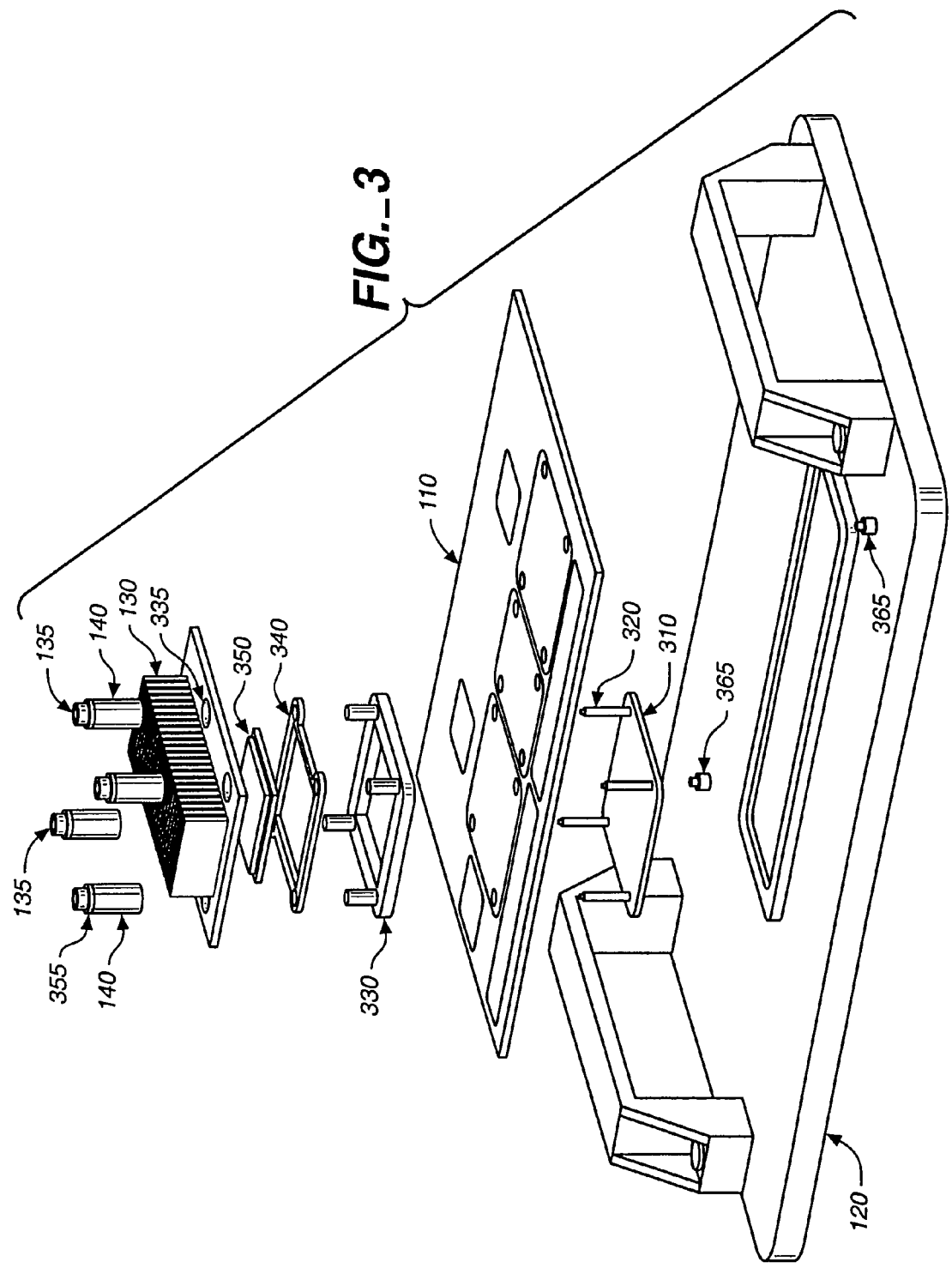
FIG._3

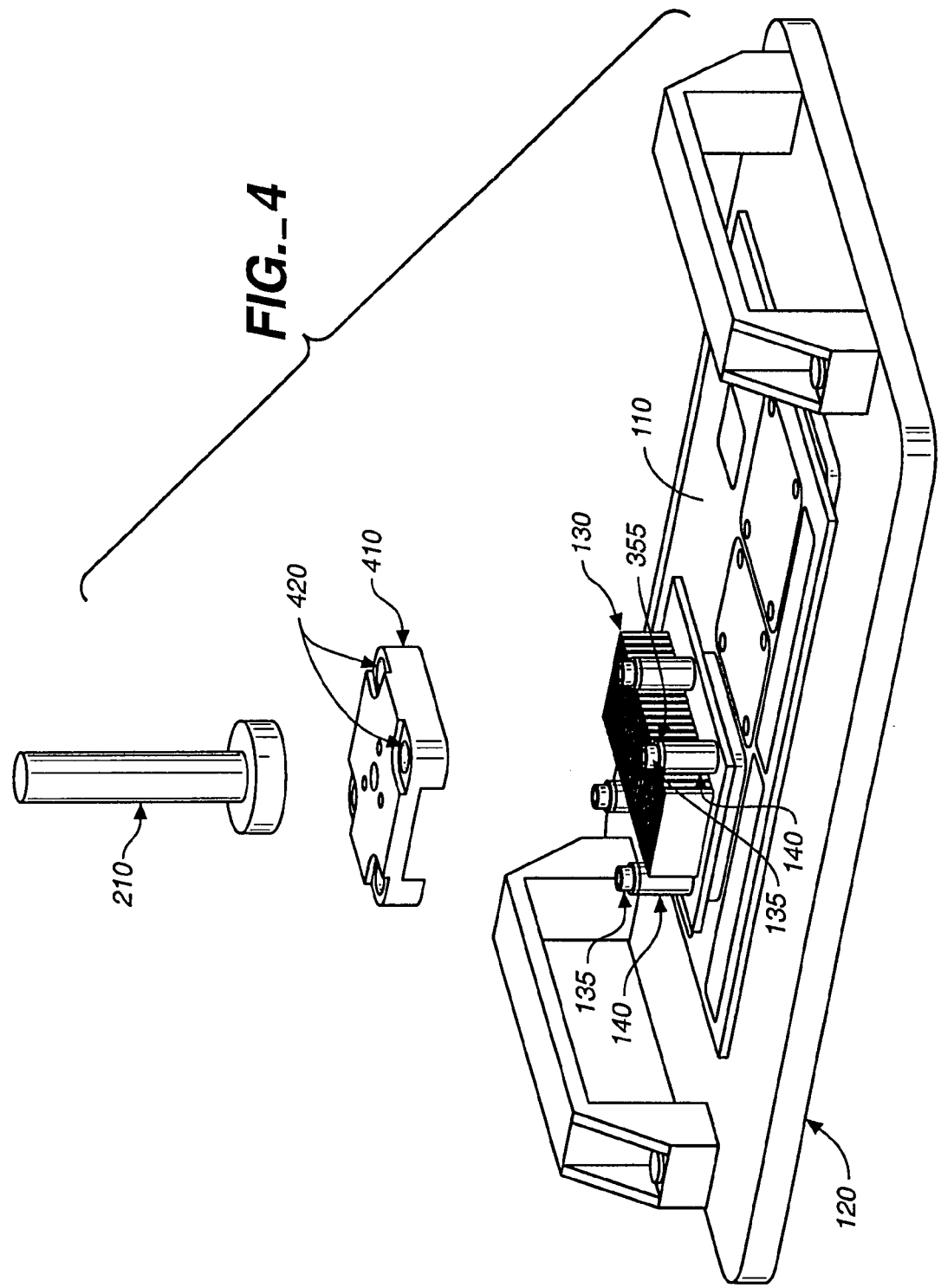
FIG._4

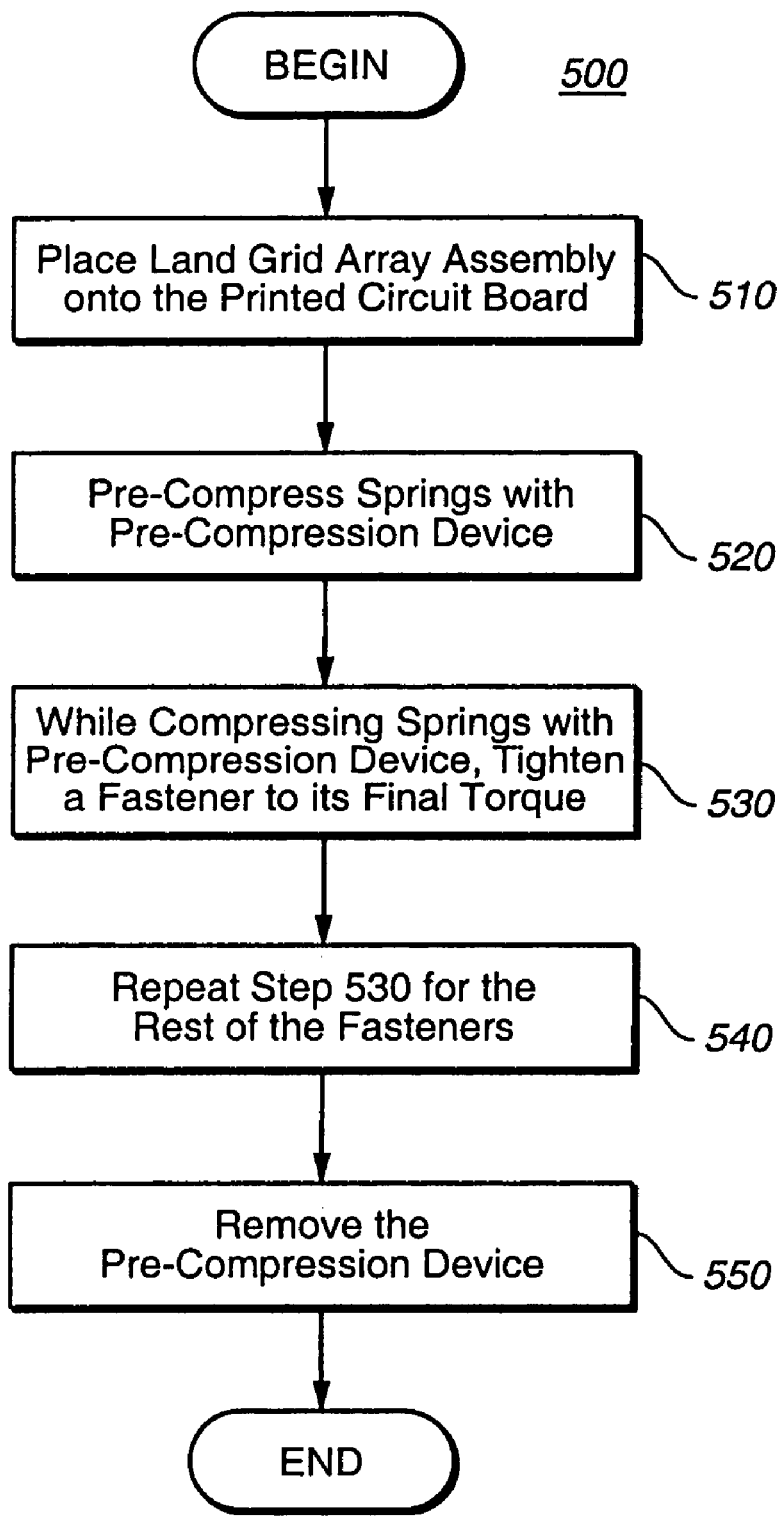
FIG._5

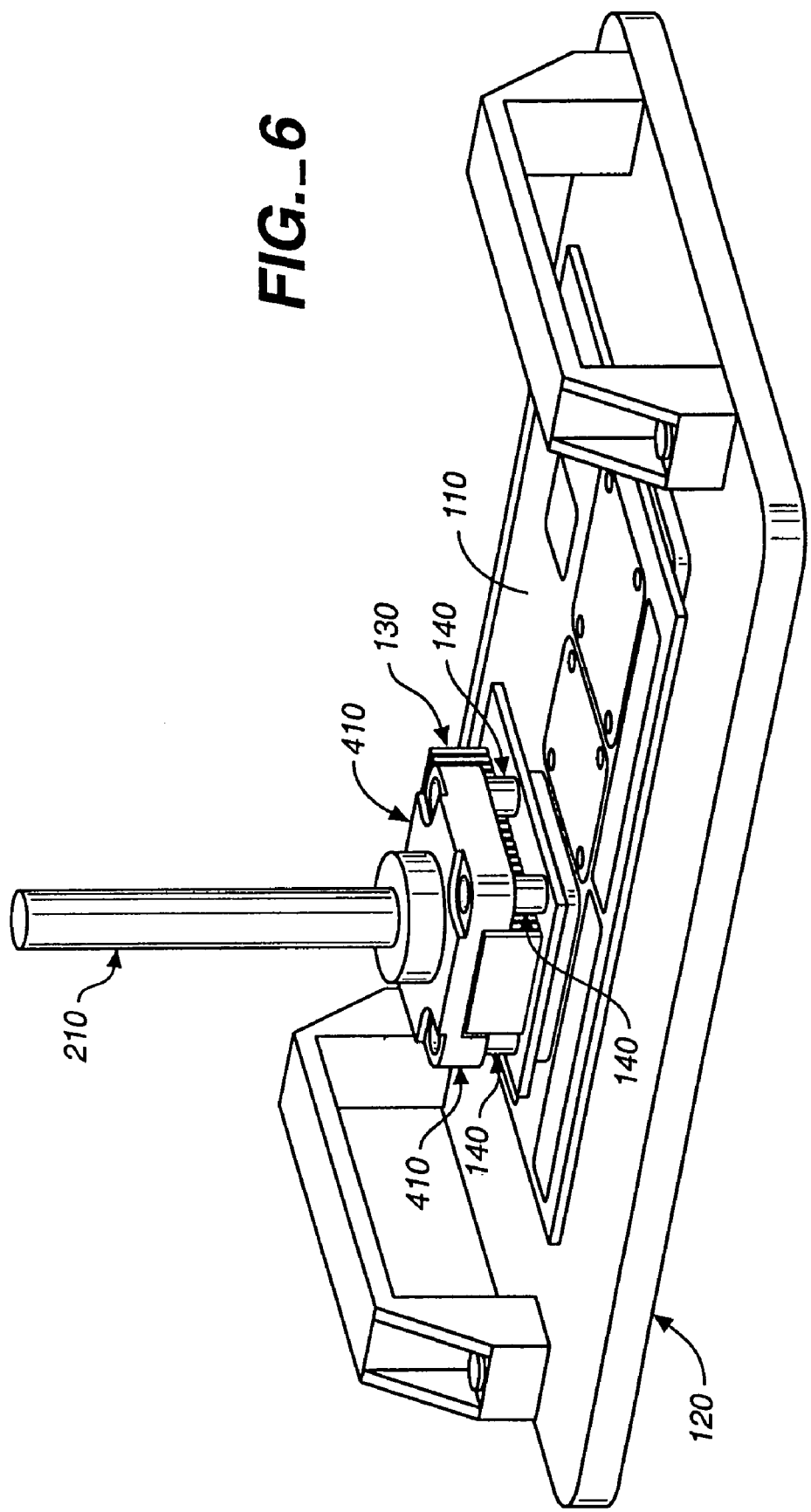
FIG._6

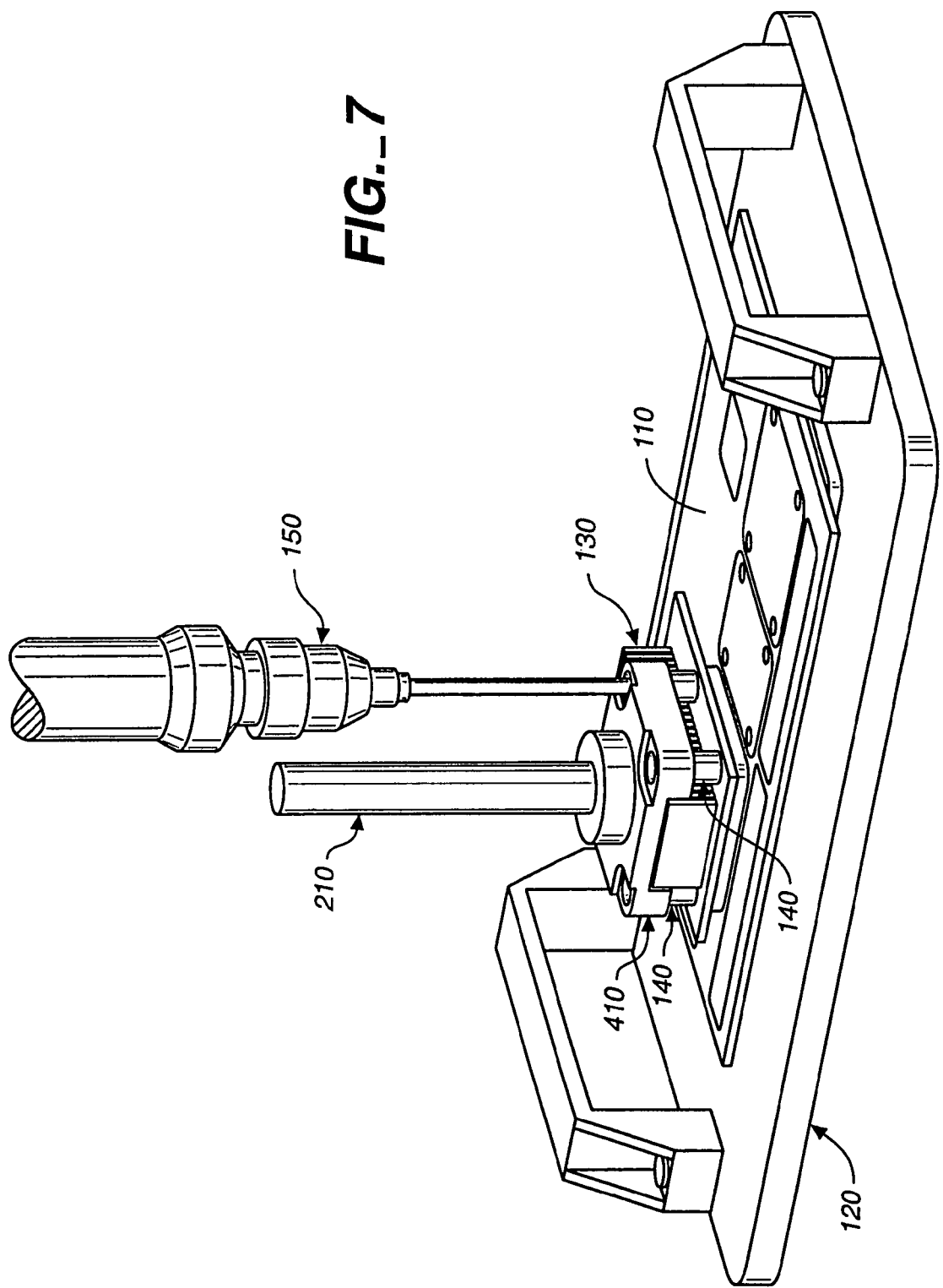
FIG._7 ated together. However,
METHOD AND SYSTEM FOR ASSEMBLING A PRINTED CIRCUIT BOARD USING A LAND GRID ARRAY This is a continuation of application Ser. No. 10/159,150, filed May 31, 2002, now U.S. Pat. No. 6,660,563.

TECHNICAL FIELD

The present invention relates to the field of assembling circuit boards. Specifically, the present invention relates to a method and system for connecting a chip package to its land grid array contacts on a circuit board by applying a pre-loading force to compression components.

BACKGROUND ART

With the ever increasing complexity of components such as microprocessors and application specific integrated circuits (ASICs) comes greater challenges in forming good electrical connections between the component and a printed circuit board. For example, these components may have hundreds of 'pins' to be connected to the printed circuit board. Land grid array sites are a popular way to connect such components to a printed circuit board. A land grid array may comprise an array of contact pads on the component that are merged with similar contact pads on the printed circuit board. An interposer between the chip package and the printed circuit board provides a frame that supports the chip package and also provides a conductive path for each of the contact pads.

In order to form a good electrical contact with such land grid array assemblies, the interposer's conductors need to be compressed. Thus, a normal force is applied to compress together the chip package and printed circuit board with the interposer sandwiched between. This force must be uniform, otherwise some of the contact pads will compress more than others, which may lead to a poor overall electrical contact. To help provide a uniform compression, land grid array sites are conventionally constructed using springs to provide a coupling force loading to a loading plate or a heatsink/heatpipe assembly. This ultimately ensures good electrical connection of a chip package to its land grid array contacts on a printed circuit board. However, conventional methods may require complex fastener torquing sequences to compress the springs, may compress the contact pads unevenly, and may apply too great a load.

FIG. 1 illustrates one method for forming an electrical contact between a component and a printed circuit board using a land grid array. However, this conventional method requires that a complex sequence of torques be applied to fasteners (e.g., screws or nuts 135) to properly attach the component such that a good electrical contact is formed between the printed circuit board 110 and the chip package (e.g., a processor, ASIC, etc.). Unfortunately, such torque sequences are not always reliable.

FIG. 1 shows a printed circuit board 110 resting in a supporting fixture 120. A heat sink 130 is being attached via four fasteners. The fastener may comprise a threaded fixture (not visible) coming up from the printed circuit board 110 with a nut 135 threaded on top. A compression component 140 (e.g., a spring) around the threaded fixture and between the bottom of the nut 135 and the heat sink 130 applies a coupling force to the heat sink 130 in response to the nut 135 being threaded down the threaded fixture. A conductive interposer (not visible) resides between the printed circuit board 110 and a chip package (not visible) underneath the heat sink 130. Thus, the chip package, interposer, and printed circuit board 110 are compressed together. However, this compression should be uniform and of proper magnitude to form good electrical contacts and not damage any components.

Thus, in this conventional method, the nuts 135 may not be simply tightened one at a time because that would result in an uneven load on the heat sink 130, interposer, etc., leading to a poor electrical contact. Thus, conventionally a small torque is applied to one nut 135, which compresses its spring 140 slightly, which in turn slightly increases the load to the heat sink 130 and components below the heat sink 130. However, this technique cannot apply to large a torque to the nut 135 or else the spring 140 would compress too much and apply too large a load on the heat sink 130 relative to the load on the heat sink 130 from the other springs 140. In other words, an uneven load on the heat sink 130 would result. Thus, the problems just mentioned will arise.

Continuing on with this conventional process, after the small torque is applied to the first nut 135, a small torque is applied to a second nut 135 to cause a small load to the heat sink 130 though the spring 140 around a second threaded fixture. Typically, all four nuts 135 receive this first small torque before applying a second small torque to each nut 135. Eventually, all the nuts 135 are tightened. However, the process can be relatively time consuming as a torque driver 150 may have to be repeatedly moved and re-positioned on the next nut 135. Furthermore, each nut 135 may only be threaded partially down the threaded fixture each step. Furthermore, this conventional technique must either count the number of turns or the torque applied to the nuts 135. Counting turns provides only a rough estimate of the torque applied and is hence inaccurate. Measuring the torque each time requires that the torque driver 150 be properly calibrated to measure fine torques. Furthermore, each time the sequence of tightening the nuts 135 is repeated, a new, higher, torque value is required. Thus, either the torque driver 150 must be adjusted or a different torque driver 150 must be used. This results in a time consuming and extremely cumbersome process to complete the assembly of the printed circuit board.

An advancement over the prior conventional method is to apply a pre-load force directly to a component, as seen in FIG. 2. Thus, the force may be applied directly onto the chip package. Alternatively, the force may be applied onto a heat sink/pipe or loading plate above the chip package. Unfortunately, this method causes loads that are greater than the final (e.g., working) load and creates unbalanced loads.

Referring now to FIG. 2, the press ram 210 compresses the heat sink 130. However, when the nuts 135 are torqued down, the heat sink 130 is subjected to a cumulative load from both the press ram 210 and the springs 140. Thus, the load is much higher than the final working load (e.g., twice the working load). This subjects the interposer contacts to higher loads than intended and it may not form a good electrical contact with the printed circuit board 110. Furthermore, the method shown in FIG. 2 may also load the heat sink 130 (and other components) unevenly unless care is taken to carefully step through a sequence in which the tightening of the nuts 135 proceeds with a sequence of step-wise tightening.

Additionally, the extra load may damage the circuit board 110 and associated components, resulting in a defect. Unfortunately, this defect may not be discovered until much later in the manufacturing process. Thus, considerable extra expense may go into assembling the circuit board 110 before the defect is detected. Furthermore, the defect may not be detected at all, and thus the customer receives a part with a latent defect.

Thus, one problem with conventional methods and systems for connecting components to a circuit board using a land grid array is that they may require application of complicated torque sequences. Another problem with such conventional methods and systems is that they may overload or apply an uneven load during the process. Thus, conventional methods and systems may damage the printed circuit board and/or its components in the connection process and/or result in an inadequate electrical connection between a chip package and the printed circuit board.

DISCLOSURE OF THE INVENTION

The present invention pertains to a device for assembling circuit boards. The device comprises an upper surface for receiving a compressing force. The device also has a lower surface for compressing a number of compression devices in a land grid array assembly while allowing access to a number of fasteners associated with the compression devices. The device is able to assist in the formation of an electrical contact between a chip package in the land grid array assembly and a circuit board by the lower surface being pressed against the compression devices to compress the compression devices and then allowing the plurality of fasteners to be tightened.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is an exploded view diagram illustrating a conventional method of connecting a component to a printed circuit board.

FIG. 2 is an exploded view diagram illustrating a conventional method of connecting a component to a printed circuit board.

FIG. 3 is an exploded view diagram illustrating a land grid array assembly, printed circuit board, and base support, according to an embodiment of the present invention.

FIG. 4 is a diagram illustrating a press ram, a compression device, and a printed circuit board on a base support, according to an embodiment of the present invention.

FIG. 5 is a flowchart illustrating steps of a process of assembling a printed circuit board, according to an embodiment of the present invention.

FIG. 6 is a diagram illustrating a compression device engaged with a land grid array assembly, according to an embodiment of the present invention.

FIG. 7 is a diagram illustrating fasteners in a land grid array assembly being torqued, according to an embodiment of the present invention.

BEST MODE FOR CARRYING OUT THE INVENTION

In the following detailed description of the present invention, a method and system for assembling circuit boards using a land grid array, numerous specific details are set forth in order to provide a thorough understanding of the present invention. However, the present invention may be practiced without these specific details or by using alternate elements or methods. In other instances well known methods, procedures, components, and circuits have not been described in detail as not to unnecessarily obscure aspects of the present invention.

One embodiment of the present invention is a method for assembling circuit boards using a land grid array. The first step involves placing the land grid array assembly onto the circuit board. The land grid array assembly may comprise a chip package, a loading plate or heat sink/pipe, compression components (e.g., springs), and fasteners (e.g., threaded fixtures and nuts). Next, the springs compressed. This compression may be performed with a pre-compression device that is attached to a press ram. Each of the springs may have a fastener associated therewith that, when tightened, applies a final (e.g., working) force to the springs. The pre-compression device may have a number of holes that are large enough to allow the fasteners to the tightened but small enough to pre-compress the springs. In this fashion, the springs apply a coupling force to the loading plate or heat sink. Then, a fastener, such as a nut on the end of a threaded fixture is tightened to it final torque, without adjusting any of the other fasteners. This is repeated for each of the other fasteners. Finally, the pre-compression device is removed, leaving the fasteners to apply the only force to the springs. The fasteners may be tightened in any sequence without risking applying an uneven load or overloading.

Embodiments of the present invention connect a chip package to a printed circuit board without requiring application of complicated torque sequences. Embodiments of the present invention do not apply uneven loads or overloads. Thus, embodiments of the present invention limit the risk of damage in the connection process. Furthermore, embodiments of the present invention do not risk inadequate electrical connection due to misapplied loads during the connection process.

FIG. 3 illustrates an exploded view of a land grid array assembly of one embodiment of the present invention, along with a printed circuit board 110 and supporting fixture 120. The printed circuit board 110 is supported by the supporting fixture 120 during assembly. A bolster plate 310 below the printed circuit board 110 has threaded fixtures 320 that will protrude through the top surface of the printed circuit board 110 when assembled. The threaded fixtures 320 serve both to align other components and as part of a fastener to compress compression components 140, such as, for example, cylindrical coil springs. Alignment pins 365 on the supporting fixture 120 help to align the printed circuit board 110. Just above the printed circuit board 110 is an alignment frame 330 that aligns the heat sink 130, which has four holes 335, two of which may be seen on the near side of the heat sink 130. The alignment frame 330 may be kept in place by the threaded fixtures 320.

Still referring to FIG. 3, above the alignment frame 330 is an interposer 340 and a chip package 350. The interposer 340 provides a frame that supports the chip package 350 and a conductive path for each of the contacts on the printed circuit board 110 and chip package 350. The chip package 350 may be, for example, a processor, an ASIC, etc. To form good electrical contact between the chip package 350 and the printed circuit board 110 a normal force may be applied to the chip package 350 to compress the contacts pads of the interposer 340. This force may be applied to the top surface or "lid" of the chip package 350 via a loading plate, heat pipe, heat sink 350, or other device. Embodiments of the present invention apply a constant normal force to the loading plate or heat sink 350 through the compression components 140. However, at different times in the assembly process, a different component serves to compress the compression components 140.

Above the heat sink 130 are four compression components 140. In FIG. 3, the compression components 140 are shown as cylindrical coil springs, although embodiments of the present invention are not so limited. The purpose of the compression components 140 may be to apply a coupling force between an element on top of the compression component 140 and a component below the compression component 140. For example, the coupling force may be between a washer 355 above a compression component 140 and the heat sink 130 below the compression component 140. However, the compression component 140 may provide a coupling force between other components.

The compression components 140 may fit around the four threaded fixtures 320. A component having central thread hole, such as, for example, a nut 135 may fit onto a threaded fixture 320 with a washer 355 between the bottom of the nut 135 and the top of the compression components 140. While shown with four threaded fixtures 320, four nuts 135, and four compression components 140 in FIG. 3, embodiments of the present invention are well-suited to more of fewer threaded fixtures 320, nuts 135, compression components 140 and associated elements (e.g., heat sink holes 335, washers 355, etc.).

It may be stated that together, a threaded fixtures 320 and a nut 135 form a fastener for fixing a loading component (e.g., loading plate, heat sink/pipe, etc.) to a circuit board 110 and for final compression of the compression components 140. However, those of ordinary skill in the art will recognize that a suitable fastener may be formed in other fashions.

Referring now to FIG. 4, an upper fixture or pre-compression device 410 is used in order to apply a pre-compression to the compression components 140. By pre-compression it may be meant that the compression is prior to any of the fasteners (e.g., nuts 135) being tightened. Furthermore, the pre-compression device 410 maintains the compression of the compression components 140 until the fasteners are tightened. Thus, initially the pre-compression device 410 compresses the compression components 140, but in the end the load is transferred to the nuts 135, whose purpose is to retain the compression components 140 in the final compressed state once the pre-compression device 410 is removed.

Also shown in FIG. 4 is a press ram 210 for applying a force to the pre-compression device 410. The press ram 210 may be, for example, a mechanical, pneumatic, or hydraulic press. The compression load is applied normal to the pre-compression device 410, in one embodiment. Press load settings should match the intended clamping load design established for each particular LGA attachment. The press ram 210 should sustain the compression on the compression components 140 during the actual attachment process, until its final release.

The pre-compression device 410 may have pre-compression device holes 420, which are large enough to fit over the heads of the nuts 135, thus exposing the nuts 135 to be tightened. The outer diameter of the washers 355 may be larger than the outer diameter of the nuts 135. The pre-compression device holes 420 may be small enough such that the washers 355 contact the lower surface of the pre-compression device 410 and may be forced down by the pre-compression device 410 to pre-compress the compression components 140. However, the pre-compression device 410 is not limited to having holes for access to the nuts 135. For example, the pre-compression device 410 may be formed with slots or other configurations, which allow free access to tighten the fasteners (e.g., nuts 135) while the pre-compression device 410 compresses the compression components 140. Furthermore, the pre-compression device 410 may be shaped such that is able to avoid significant direct contact with the loading plate or heat sink 130 while compressing the compression components 140. The pre-compression device 410 may also have alignment features to allow alignment with the press ram 210, so compression force can be applied centered with respect to the compression components 140 arrangement.

An embodiment of the present invention provides for a process of assembling a printed circuit board 110. Reference will now be made to process 500 of FIG. 5 and to the diagrams in FIG. 3, FIG. 4, FIG. 6, and FIG. 7. In step 510, the land grid array assembly is placed onto the printed circuit board 110. (This step may instead comprise receiving a land grid array assembly having a chip package and a loading component on a circuit board.) The land grid array assembly may include a chip package 350, an interposer 340, a loading plate or heat sink/pipe 130, compression components 140, and fasteners. FIG. 3 illustrates an exploded view of the land grid array assembly, while FIG. 4 illustrates those elements the land grid array assembly on the printed circuit board 110 with a press ram 210 and pre-compression device 420 above. Throughout this description, the press ram 210 and pre-compression device 420 may be termed a press device.

Referring to step 520 of FIG. 5 and to the diagram of FIG. 6, the compression components 140 are pre-compressed by the press device (e.g., press ram 210 and pre-compression device 420). The compression components 140 may apply a coupling load to the loading plate or heat sink 130.

Referring now to step 530 of FIG. 5 and to the diagram of FIG. 7, one of the nuts 135 (not visible in FIG. 7) is tightened. This occurs while the press device is still applying a force to the compression components 140. FIG. 7 shows the tightening being done with a torque driver 150, which may be pneumatically driven. However, embodiments of the present invention may use any suitable method to torque the nuts 135.

In step 540 of process 500 of FIG. 5, the rest of the nuts 135 are torqued to their final (e.g., working) torque. Unlike conventional methods, the first nut 135 may be torqued to its final (e.g., working) torque before torquing any of the other nuts 135. This may simplify the process and requires only a single torque driver 150. For example, the torque driver 150 may be programmed to torque the first fastener to it full tightness before torquing a second fastener to it full tightness. However, embodiments of the present invention are not so limited. For example, multiple torque drivers 150 may be used, and it is not required that the first nut 135 be tightened to its final torque before applying torque to a second nut 135.

Finally, in step 550, the compression device 410 and press ram 210 are removed. This leaves only the nuts 135 applying a downward force onto the top of the compression components 140 via the washers 355. Process 500 then ends. Throughout process 500 the heat sink 130 and other components (e.g., interposer 340, chip package, contact pads, etc.) are not overloaded or subjected to an uneven load.

While the present invention has been described in particular embodiments, it should be appreciated that the present invention should not be construed as limited by such embodiments, but rather construed according to the below claims.

We claim:

1. A device for assembling circuit boards, said device comprising:
    an upper surface for receiving a compressing force; and
    a lower surface for compressing a plurality of compression devices in a land grid array assembly while allowing access to a plurality of fasteners associated with said compression devices;
    wherein said device is operable to assist in the formation of an electrical contact between a chip package in the land grid array assembly and a circuit board by said lower surface being pressed against said plurality of compression devices to compress said compression devices and then allowing said plurality of fasteners to be tightened.

2. The device of claim 1, wherein said lower surface is shaped to avoid contacting a loading plate that is a part of the land grid array assembly while compressing the plurality of compression devices to load the loading plate.

3. The device of claim 1, wherein said lower surface is shaped to avoid directly loading a heat sink that is a part of the land grid array assembly while compressing the plurality of compression devices to load the heat sink.

4. The device of claim 1, wherein said device has a plurality of holes running from said upper surface to said lower surface, said plurality of holes large enough to allow the plurality of fasteners to be accessed and small enough such that said lower surface is operable to compress the plurality of compression devices.

5. The device of claim 1, wherein said lower surface is further operable to press against a plurality of washers on top of the plurality of compression devices.

6. A method for assembling circuit boards, comprising:
    a) receiving a land grid array assembly having a chip package and a loading component on a circuit board;
    b) applying a press device to compress a plurality of compression components that apply a coupling force to said loading component, wherein said loading component compresses said chip package to said circuit board;
    c) while continuing to apply said press device, tightening a plurality of fasteners associated with said plurality of compression components; and
    d) removing said press device from said plurality of compression components, wherein said plurality of fasteners compress said plurality of compression components.

7. The method of claim 6, wherein said c) comprises:
    c1) tightening a first fastener of said plurality of fasteners to its final torque; and
    c2) repeating said c1) one fastener of said plurality of fasteners at a time for the rest of said plurality of fasteners.

8. The method of claim 6, wherein said c) comprises tightening said plurality of fasteners by accessing said fasteners through said holes using a torque driver.

9. A system for assembling circuit boards, said system comprising:
    a base for holding a circuit board having a land grid array assembly having a chip package, a loading component engaging the chip package, a plurality of compression components coupled to the loading component, and a plurality of fasteners engaging the plurality of compression components;
    a press ram for compressing the land grid array assembly to form an electrical contact between the chip package and the circuit board; and
    a pre-compression device coupled to said press ram and for compressing the compression components to apply a coupling force to the loading component while allowing the fasteners to be accessed for tightening.

10. The system of claim 9, further comprising:
    a torque driver to tighten the plurality of fasteners while said pre-compression device is compressing the plurality of compression components, wherein said pre-compression device is removed from the compression components leaving the fasteners to apply a final compression to the compression components.

11. The system of claim 9, wherein said pre-compression device is operable to compress the compression devices thus loading the loading component without said pre-compression device applying a substantial load by direct contact to the loading component.

12. The system of claim 11, wherein the loading component is a loading plate.

13. The system of claim 11, wherein the loading component is a heat sink.

* * * * *